(12) United States Patent
Ishikawa et al.

(10) Patent No.: US 8,154,341 B2
(45) Date of Patent: Apr. 10, 2012

(54) POWER AMPLIFYING APPARATUS

(75) Inventors: Hiroyoshi Ishikawa, Kawasaki (JP);
Nobukazu Fudaba, Kawasaki (JP);
Hajime Hamada, Kawasaki (JP); Yuichi Utsunomiya, Kawasaki (JP); Kazuo Nagatani, Kawasaki (JP); Toru Maniwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 125 days.

(21) Appl. No.: 12/335,572

(22) Filed: Dec. 16, 2008

(65) Prior Publication Data

US 2009/0160548 A1 Jun. 25, 2009

(30) Foreign Application Priority Data

Dec. 20, 2007 (JP) .................... 2007-329371

(51) Int. Cl.
*H03G 3/20* (2006.01)
(52) U.S. Cl. .................. 330/136; 330/127; 330/297
(58) Field of Classification Search .................. 330/136, 330/127, 297
See application file for complete search history.

(56) References Cited

U.S. PATENT DOCUMENTS

| | | | |
|---|---|---|---|
| 5,144,258 A | 9/1992 | Nakanishi et al. | |
| 5,281,925 A * | 1/1994 | Hulick | 330/296 |
| 6,421,533 B1 * | 7/2002 | Greverie | 455/126 |
| 6,825,726 B2 * | 11/2004 | French et al. | 330/297 |
| 7,091,780 B2 * | 8/2006 | Bienek et al. | 330/149 |
| 7,447,485 B2 | 11/2008 | Ishikawa et al. | |
| 7,535,310 B2 * | 5/2009 | Shimizu et al. | 332/103 |
| 2004/0198258 A1 | 10/2004 | Tanaka et al. | |
| 2007/0146068 A1 | 6/2007 | Ishikawa et al. | |

FOREIGN PATENT DOCUMENTS

| | | |
|---|---|---|
| CN | 1988373 | 6/2007 |
| JP | 5-316012 | 11/1993 |
| JP | 10-341114 | 12/1998 |
| JP | 2004-320735 | 11/2004 |

OTHER PUBLICATIONS

Chinese Office Action dated Dec. 21, 2010, from corresponding Chinese Application No. 200810183796.3.
Korean Office Action dated Aug. 10, 2010, from corresponding Korean Application No. 10-2008-129414.
Notification of Reasons for Refusal dated Jul. 5, 2011, from corresponding Japanese Application No. 2007-329371.

* cited by examiner

*Primary Examiner* — Patricia Nguyen
(74) *Attorney, Agent, or Firm* — Katten Muchin Rosenman LLP

(57) ABSTRACT

A power amplifying apparatus includes a high-speed low pass filter which inputs an envelope signal included in a transmission signal therein, a low-speed low pass filter which inputs the envelope signal therein, a determination unit which inputs the envelope signal therein and determines rising or falling of the envelope signal, a selecting unit which selects one of the high-speed low pass filter and the low-speed low pass filter according to a determined result of the determination unit, and a voltage supply unit which generates a voltage based on a signal input according to a selection by the selecting unit and supplies the voltage to a power amplifier which inputs the transmission signal therein so as to amplify a power of the transmission signal.

8 Claims, 16 Drawing Sheets

POWER AMPLIFYING APPARATUS

CROSS-REFERENCE TO RELATED APPLICATION

This application is based upon and claims the benefit of priority of the prior Japanese Patent Application No. 2007-329371, filed on Dec. 20, 2007, the entire contents of which are incorporated herein by reference.

FIELD

The present invention relates to a power amplifying apparatus to be used in a transmission section of a mobile terminal device, a radio relay device or the like. The power amplifying apparatus includes a technique which improves a power use efficiency of a transmission section.

BACKGROUND

As one of techniques which improves power use efficiency of a power amplifier to be used in a transmission section of a mobile terminal device, a radio relay device or the like, an envelope tracking method (ET) is known. This method is a technique which controls a drain voltage or a collector voltage according to an envelope fluctuation of a transmission signal so as to heighten the power use efficiency of the power amplifier.

FIG. 1 illustrates a constitutional example of a power amplifying apparatus using the envelope tracking method. The power amplifying apparatus 70 includes an envelope arithmetic section 71, a power supply circuit 72 and a power amplifier 73. The envelope arithmetic section 71 calculates envelope information included in a transmission signal, and supplies the envelope information to the power supply circuit 72. The power supply circuit 72 is composed of a switching amplifier having high power conversion efficiency, for example. The power supply circuit 72 amplifies an output from the envelope arithmetic section 71 so as to generate a drain voltage, and supplies the drain voltage to the power amplifier 73 so as to amplify the transmission signal.

In the power amplifier 73, however, the switching amplifier used in the power supply circuit 72 does not have a conversion speed which is sufficient for tracking a change in the envelope information of the transmission signal.

Therefore, a voltage control speed adjusting section 74 composed of a low pass filter (LPF) is provided between the envelope arithmetic section 71 and the power supply circuit 72 as illustrated in FIG. 2 conventionally. The voltage control speed adjusting section 74 limits a band of the envelope signal and makes a change in the signal gentle so as to supply the signal to the power supply circuit 72. A carrier wave input section 75 illustrated in FIG. 2 is a circuit which multiplies a transmission signal by a carrier wave so as to up-convert it into a radio frequency band.

FIG. 3 is a waveform chart of a conventional circuit illustrated in FIG. 2 and a two-tone signal which changes greatly and cannot be tracked by the power supply circuit 72 as an example of a transmission signal. "a" in FIG. 3 denotes an envelope signal (two-tone signal) to be output from the envelope arithmetic section 71. The band of this envelope signal is limited by the voltage control speed adjusting section 74, and the signal is adjusted to an output signal b whose change is gentle. When the output signal b is amplified by the power supply circuit (switching amplifier) 72, since the speed is adjusted, the signal can sufficiently follow the amplifying process in the power supply circuit 72, and an output voltage c whose waveform is approximately matched with that of the output signal b can be obtained. The output voltage c is supplied as a drain voltage to the power amplifier 73.

Japanese Patent Application Laid-Open No. 05-316012 discloses a technique which controls rising and falling of a waveform of a trapezoidal envelope signal included in a transmission signal so as to control a spread of a power spectrum of a transmission output signal to a predetermined width.

However, since slowdown of the envelope signal by means of the conventional voltage control speed adjusting section 74 ignores a property of the switching amplifier, the power amplifying apparatus with low power use efficiency is obtained. This is concretely described below.

FIG. 4 is a diagram describing a constitution of the power supply circuit (switching amplifier) 72, and includes a modulator 77, a power switch 78 and an LC filter 79. An envelope signal is first input into the modulator 77 so as to be pulse-modulated, and is amplified by the power switch 78. Further, the signal is smoothed by the LC filter 79 so as to be generated as a drain voltage of the power amplifier 73.

FIG. 5 is a diagram describing a signal waveform in the switching amplifier. In FIG. 5, d denotes an input signal to be input into the modulator 77, and it is pulse-modulated by the modulator 77, so as to have a comb-shaped waveform as illustrated by e. "f" denotes an output waveform smoothed by the LC filter 79.

When the input signal d is compared with the output signal f, a relationship between the input signal d and the output signal f on the rising of the signal establishes that input>output. On the other hand, this relationship does not hold on the falling of the signal. That is to say, when the envelope signal is slowed down by the conventional technique, the slowdown of a signal tracking speed which occurs due to the LC filter 79 may be improved only on the rising of the signal, and the slowdown is not necessary on the falling of the output signal. That is to say, when the slowdown is carried out also on the falling of the signal, useless power is consumed, and the power use efficiency is deteriorated.

SUMMARY

In view of the above-described circumstances, embodiments discussed herein provide a power amplifying apparatus and a method for controlling a supply voltage to a power amplifier which changes an adjusting speed of an envelope signal on rising and falling of the envelope signal so as to improve power use efficiency of the power amplifying apparatus without reducing a signal speed on the falling of the envelope signal.

According to an aspect of the embodiments, a power amplifying apparatus disclosed includes a high-speed low pass filter which inputs an envelope signal included in a transmission signal therein, a low-speed low pass filter which inputs the envelope signal therein, a determination unit which inputs the envelope signal therein and determines rising or falling of the envelope signal, a selecting unit which selects the high-speed low pass filter or the low-speed low pass filter according to a determined result of the determination unit, and voltage supply unit which generates a voltage based on a signal input according to selection of the selecting unit and supplies the voltage to a power amplifier which inputs the transmission signal therein so as to amplify power of the transmission signal.

And according to another aspect of the embodiments, in a control method for a supply voltage to a power amplifier which amplifies power of a transmission signal based on envelope information of the transmission signal disclosed, the control method for a voltage to the power amplifier is changed on rising and falling of an envelope signal as the envelope information.

Additional objects and advantages of the embodiment will be set forth in part in the description which follows, and in part will be obvious from the description, or may be learned by practice of the embodiment. The object and advantages of the embodiment will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

A disclosed power amplifying apparatus according to embodiments is described below with reference to the drawings.

First Embodiment

Figure 1:
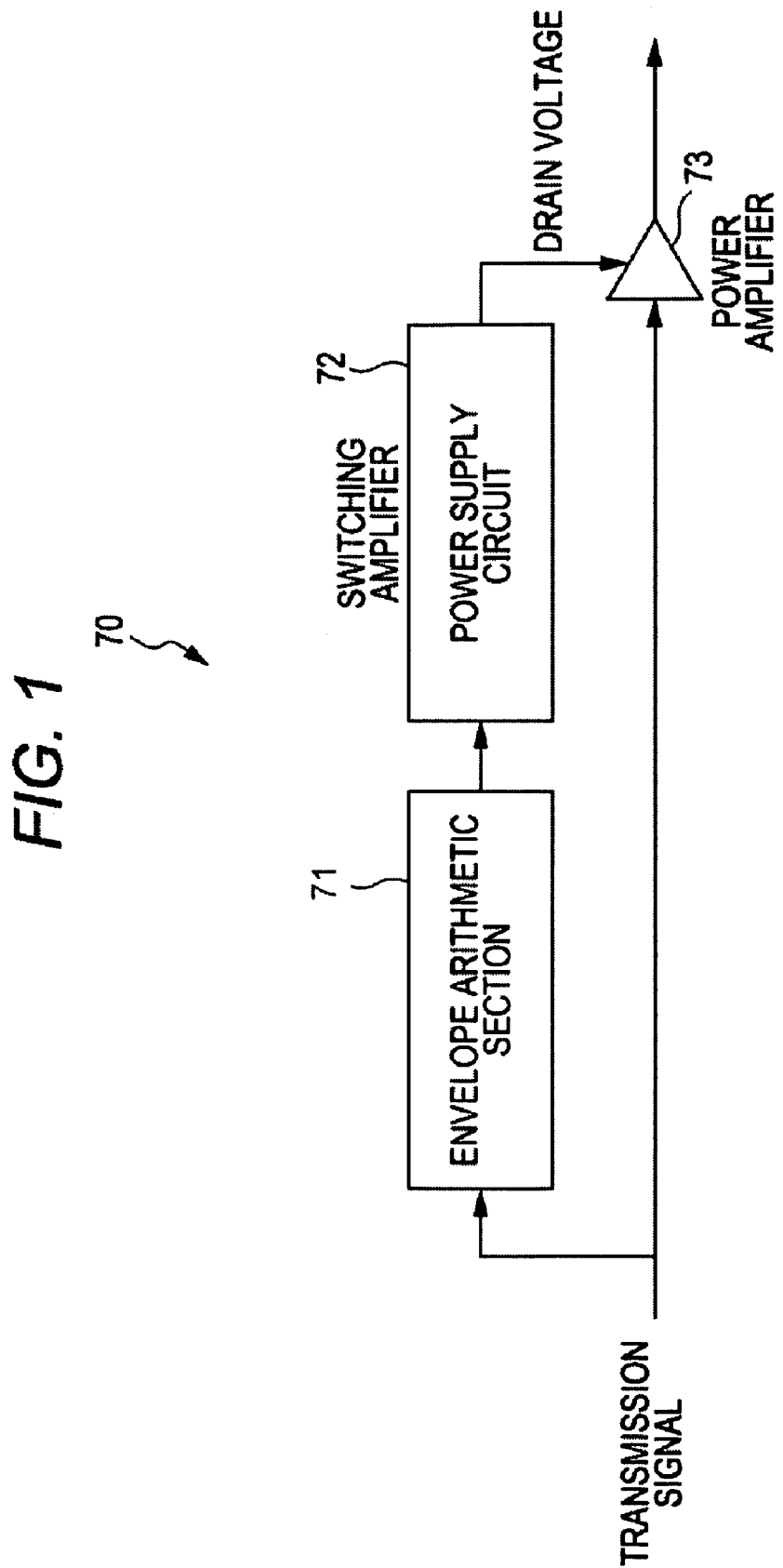
FIG. 1 is a diagram illustrating a constitutional example of a conventional power amplifying apparatus using an envelope tracking method.
Figure 2:
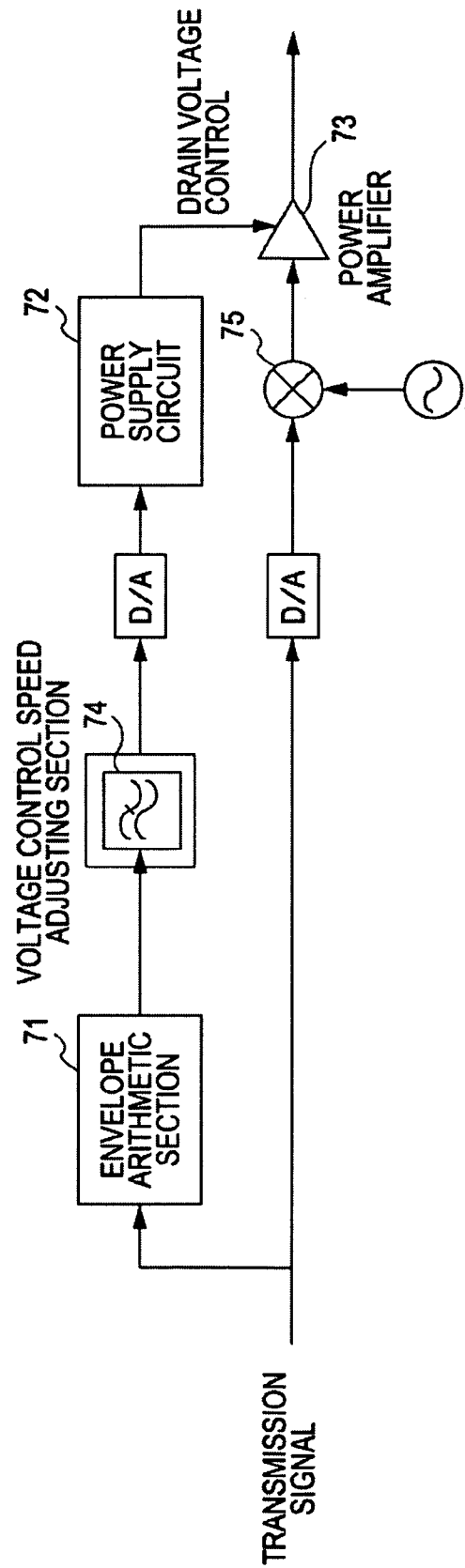
FIG. 2 is a diagram illustrating a circuit configuration of the conventional power amplifying apparatus.
Figure 3:
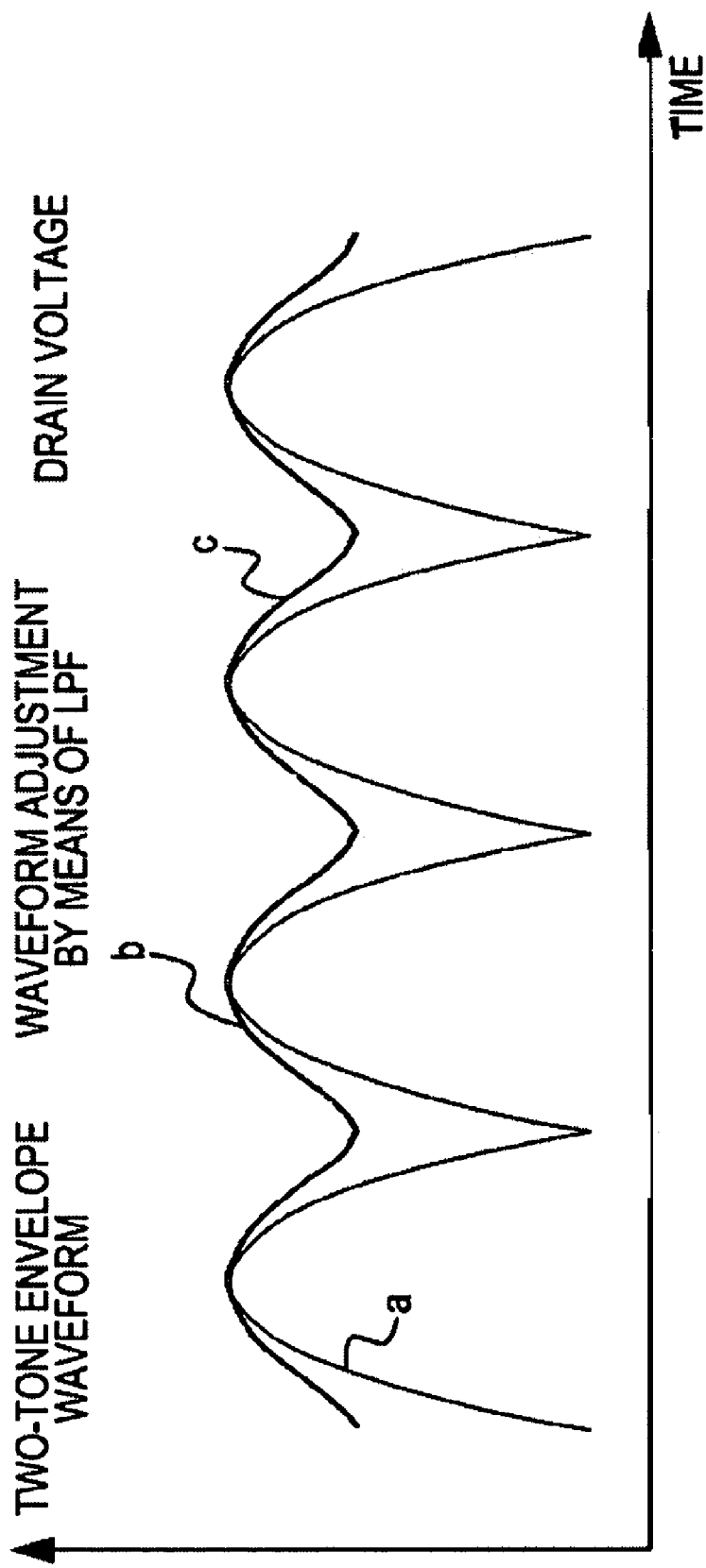
FIG. 3 is a diagram illustrating a waveform chart of a conventional circuit.
Figure 4:
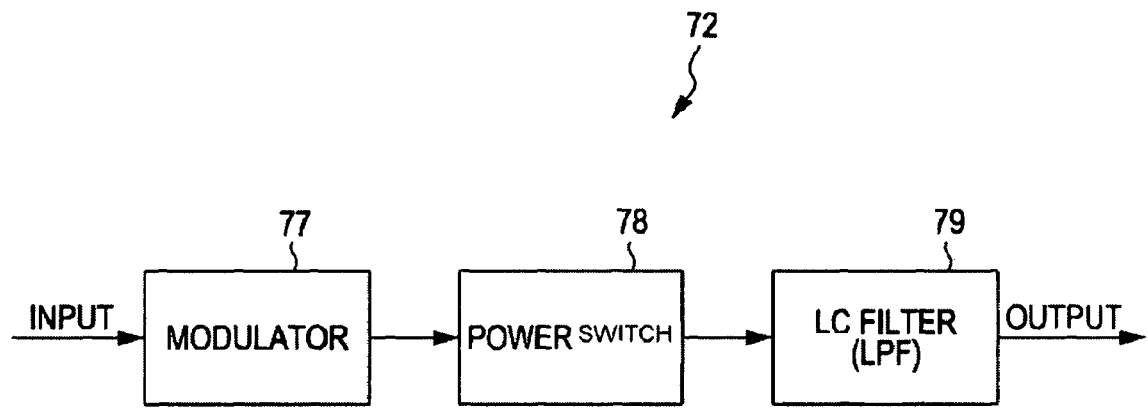
FIG. 4 is a diagram illustrating a constitutional example of a switching amplifier.
Figure 5:
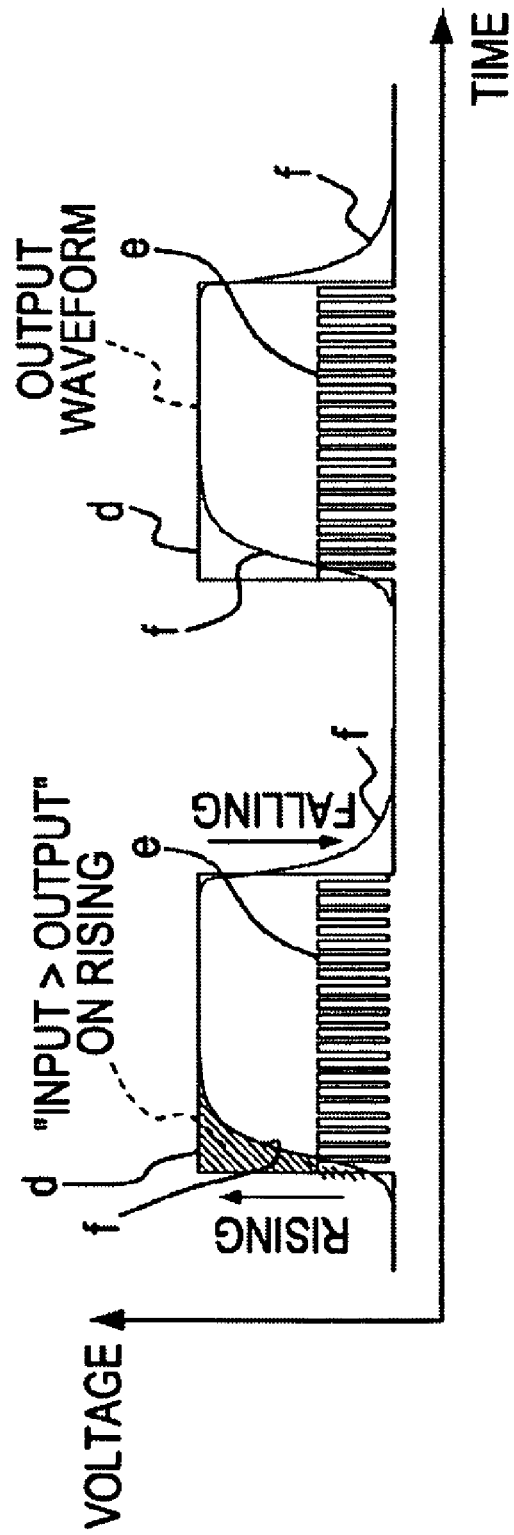
FIG. 5 is a diagram illustrating a problem of the conventional circuit.
Figure 6:
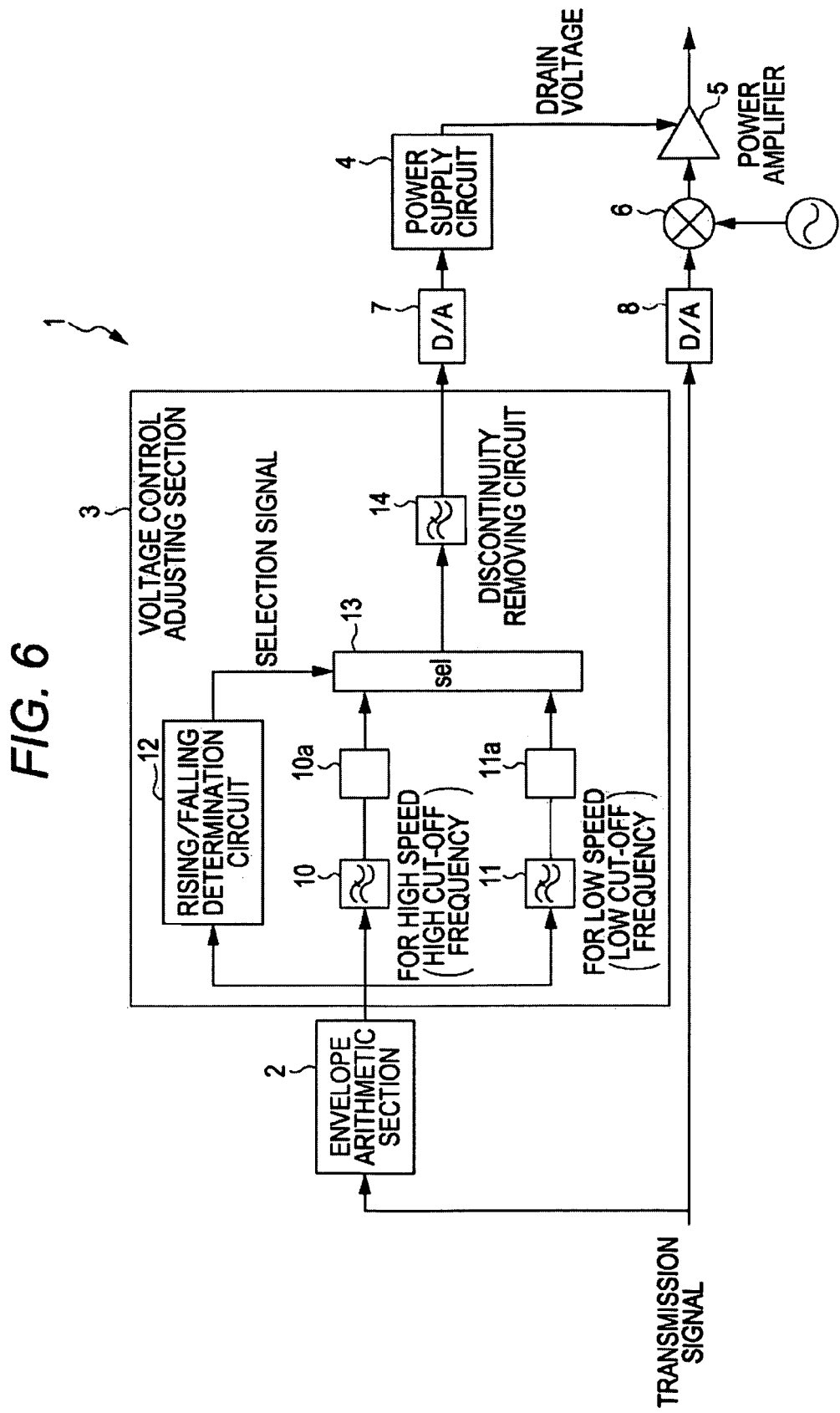
FIG. 6 is a circuit diagram of a power amplifying apparatus according to a first embodiment.

FIG. 6 is a circuit diagram of the power amplifying apparatus according to the first embodiment.

In FIG. 6, the power amplifying apparatus 1 includes an envelope arithmetic section 2, a voltage control adjusting section 3, a power supply circuit 4, a power amplifier 5, a carrier wave input section 6, digital/analog converting circuits (hereinafter, D/A converting circuits) 7 and 8. The power amplifying apparatus 1 is used in a transmission section of a mobile telephone or a transmission section of a radio relay station, for example, and a transmission signal includes audio information or the like.

The envelope arithmetic section 2 calculates an envelope component included in the transmission signal and outputs it to the voltage control adjusting section 3. The voltage control adjusting section 3 includes low pass filters (LPF) 10 and 11, a rising/falling determination circuit 12, a selecting circuit 13, and a discontinuity removing circuit 14. The low pass filter (LPF) 10 is for a high cut-off frequency (for high speed), and the low pass filter (LPF) 11 is for a low cut-off frequency (for low speed).

The rising/falling determination circuit 12 detects a trough or a crest of an envelope signal to be input, and when detecting a trough of the envelope signal, it determines that the envelope signal rises thereafter. On the other hand, when detecting a crest of the envelope signal, the rising/falling determination circuit 12 determines that the envelope signal falls thereafter.

The selecting circuit 13 selects an output from the low pass filter (LPF) 10 or 11 based on the determined signal from the rising/falling determination circuit 12, and outputs the selected output to the discontinuity removing circuit 14. The discontinuity removing circuit 14 is a circuit which removes discontinuity generated at the time of switching signals, and is composed of a low pass filter (LPF), for example.

The carrier wave input section 6 is a circuit which supplies a carrier wave to a transmission signal. The D/A converting circuit 7 converts a signal output from the voltage control adjusting section 3 into an analog signal, and the D/A converting circuit 8 converts a transmission signal into an analog signal.

The power supply circuit 4 may be a switching amplifier that is composed of a modulator, a power switch and an LC filter (not shown). The power supply circuit 4 pulse-modulates the D/A-converted output signal from the voltage control adjusting section 3 and amplifies the modulated signal using the power switch. Thereafter, the power supply circuit 4 generates a drain voltage via the LC filter and supplies it to the power amplifier 5.

Figure 7:
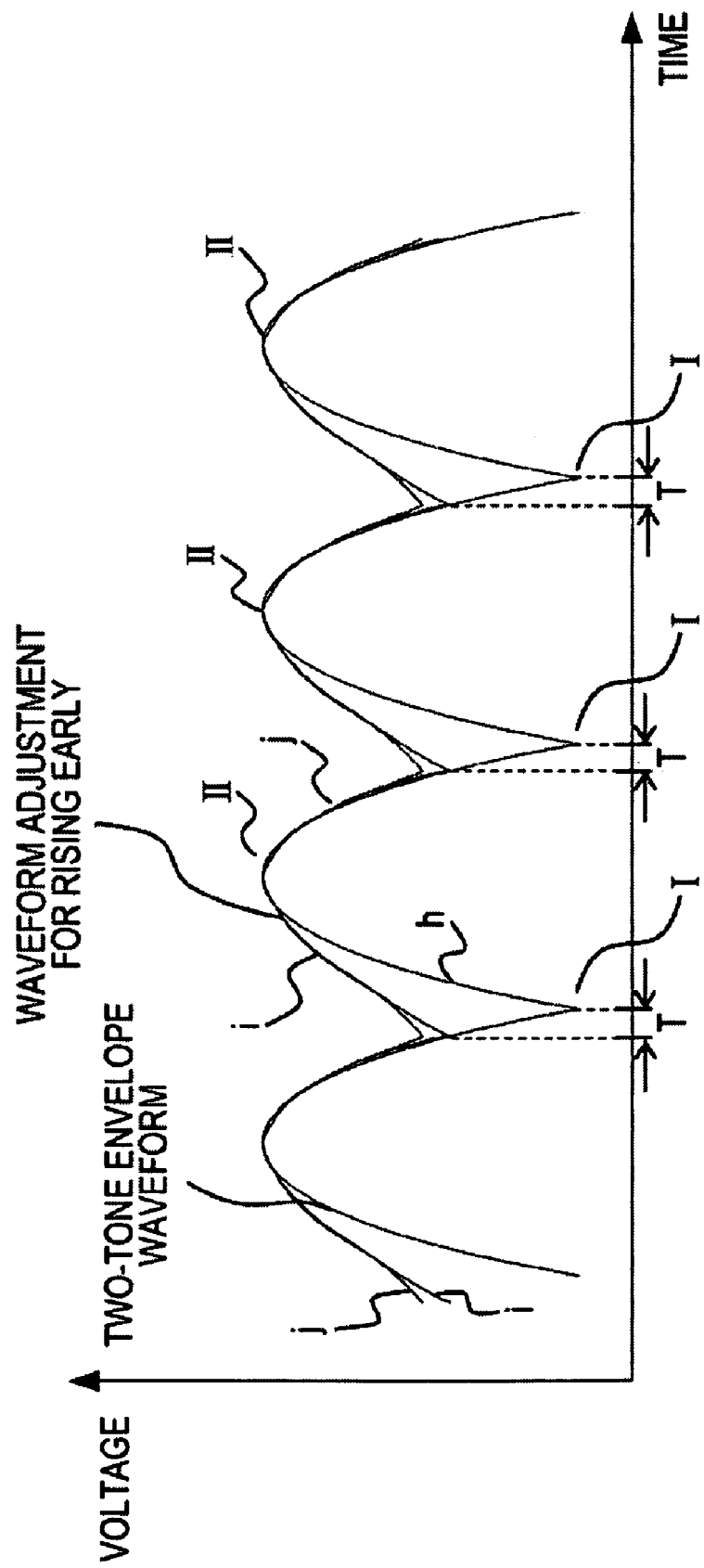
FIG. 7 is a waveform chart showing speed adjustment of an envelope signal in a voltage control adjusting section.

FIG. 7 is a waveform chart illustrating speed adjustment of the envelope signal in the voltage control adjusting section 3. The envelope signal calculated by the envelope arithmetic section 2 is input into the low pass filters (LPF) 10 and 11, and the rising/falling determination circuit 12.

When the rising/falling determination circuit 12 detects a trough of the envelope signal (I in FIG. 7), it determines that the envelope signal rises thereafter, and outputs a determined signal for selecting the low pass filter (LPF) 11 to the selecting circuit 13. A delay circuit 11a is set at an output of the low pass filter (LPF) 11, and an output from the low pass filter (LPF) 11 is delayed by predetermined time T so as to be output to the selecting circuit 13. Therefore, in this case, rising h of the envelope signal is adjusted to a low speed by the low pass filter (LPF) 11 and is adjusted to i in FIG. 7 so as to be output from the selecting circuit 13 to the discontinuity removing circuit 14.

On the other hand, when the rising/falling determination circuit 12 detects a crest (II described in FIG. 7) of the envelope signal, it determines that the envelope signal falls thereafter, and outputs a determined signal for selecting the low pass filter (LPF) 10 to the selecting circuit 13. The delay circuit 10a is set also at an output of the low pass filter (LPF) 10, and the output from the low pass filter (LPF) 10 is delayed by predetermined time T so as to be output to the selecting circuit 13. At this time, the determined signal to be input into the signal circuit is also delayed by T so as to be changed.

Therefore, the output from the selecting circuit 13 is switched into a signal of the low pass filter (LPF) 10 at timing of the crest of the envelope signal, so as to be supplied to the discontinuity removing circuit 14.

The discontinuity removing circuit 14 removes discontinuity of the adjusted envelope signal, and outputs a signal adjusted to the power supply circuit 4 via the D/A converting circuit 7. The power supply circuit 4 pulse-modulates a signal to be input and amplifies it using the power switch so as to supply it to the LC filter.

Figure 8:
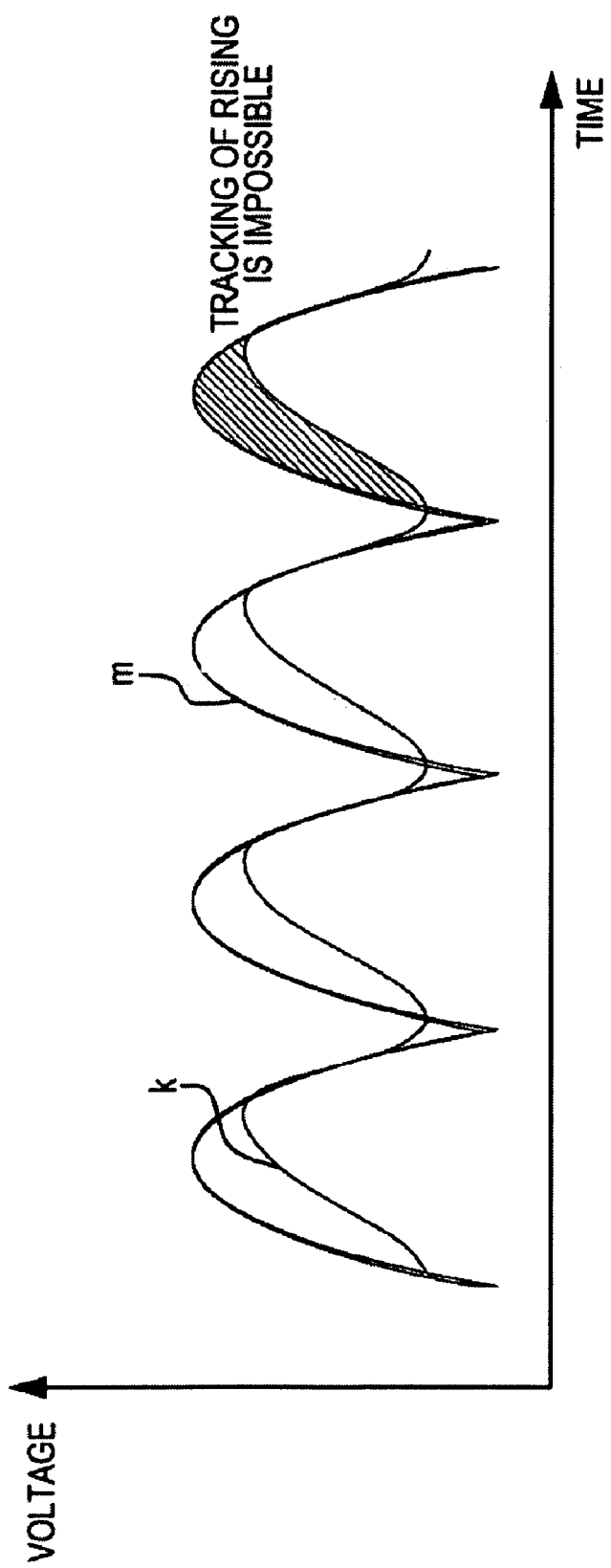
FIG. 8 is a diagram illustrating a waveform characteristic of the envelope signal at the time of passing through an LC filter.

FIG. 8 is a diagram showing a signal waveform at the time of passing through the LC filter of the power supply circuit 4. When passing through the LC filter, the rising of the envelope signal is delayed as shown by k in FIG. 8. In this embodiment, the signal to be supplied to the LC filter has the signal waveform adjusted as illustrated in FIG. 7. That is to say, in this embodiment, the rising of the signal to be input is early, and as illustrated by i in FIG. 7, the signal rises early. After the signal passes through the LC filter, its output waveform is j as shown in FIG. 7.

Therefore, the output signal from the voltage control adjusting section 3 is amplified by the switching amplifier, and a voltage having a voltage waveform j is supplied to a drain of the power amplifier 5. This drain voltage is a voltage whose falling tracks the envelope signal, and thus useless power consumption is eliminated and the power use efficiency can be improved.

In the above constitution, when the rising of the envelope signal is detected, the envelope signal which passes through the low-speed low pass filter is selected. When the falling of the envelope signal is detected, the envelope signal which passes the high-speed low pass filter is selected. The rising of the envelope signal is adjusted to a low speed, and the falling of the envelope signal is adjusted to a high speed, so that the voltage amplified by the power supply circuit 4 as a switching amplifier is supplied as a drain voltage to the power amplifier 5.

As a result, a driving voltage which is optimum for a driving property of the power supply circuit 4 can be supplied to the power amplifier, and the power use efficiency can be improved.

The power supply circuit 4, the rising/falling determination circuit 12 and the selecting circuit 13 in the first embodiment correspond to voltage supply means, determination means and selecting means of the disclosed power amplifying apparatus, respectively.

Second Embodiment

A second embodiment of the disclosed power amplifying apparatus is described below.

Figure 9:
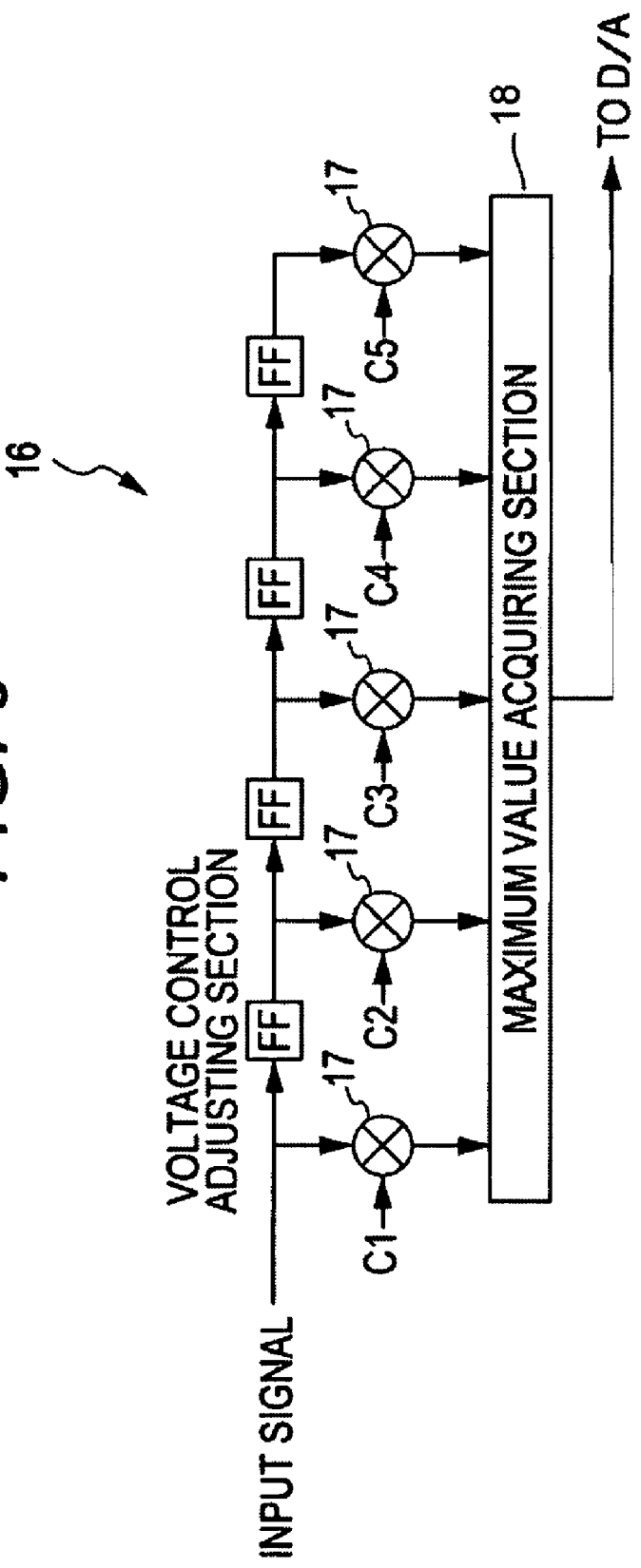
FIG. 9 is a circuit diagram for explaining a second embodiment, and particularly a diagram illustrating the circuit configuration of the voltage control adjusting section.

FIG. 9 is a circuit diagram for explaining the second embodiment, and particularly a diagram illustrating a circuit configuration of the voltage control adjusting section. In FIG. 9, the circuit configuration except for the voltage control adjusting section is the same as that in FIG. 6, and the description thereof is omitted.

The voltage control adjusting section 16 in the second embodiment is a window function processing circuit, and includes flip-flops (FF), window function coefficient multiplying sections 17 and a maximum value acquiring section 18 which acquires a maximum value. The envelope signal calculated in the envelope arithmetic section 2 is synchronized with a clock signal, not shown, so as to be input into the flip-flops (FF), and envelop signals for N clock, for example, are retained. The window function coefficient multiplying sections 17 multiply corresponding outputs from the flip-flops (FF) by window function coefficients C1 to C5, and supply the multiplied results to the maximum value acquiring section 18. The maximum value acquiring section 18 selects a maximum value from the N-numbered multiplied results (for example, 5 results in the example of FIG. 9), and outputs the selected maximum value to the power supply circuit 4 via the D/A converting circuit 7.

Figure 10:
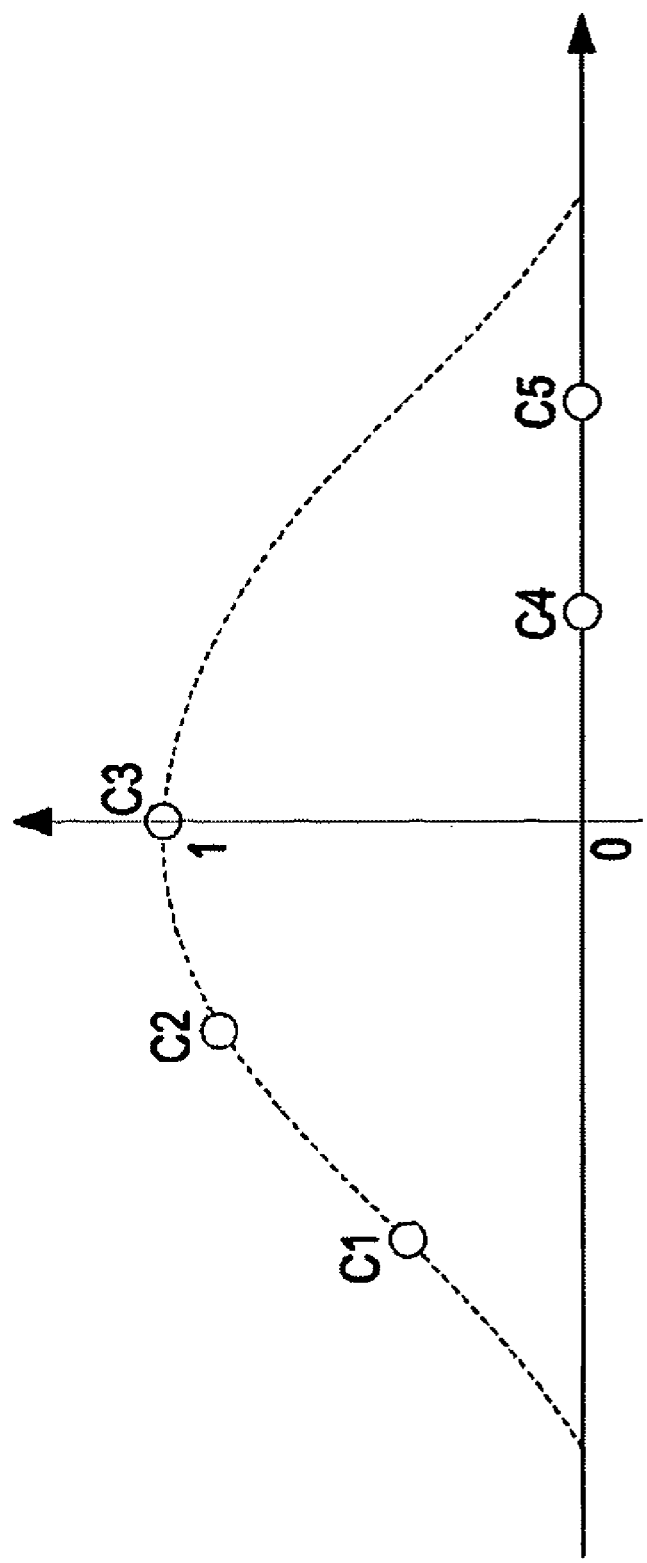
FIG. 10 is a diagram explaining a window coefficient.

FIG. 10 is a diagram illustrating an example of the window function coefficients subject to the multiplying process in the window function coefficient multiplying sections 17. An example shown in FIG. 10 uses five-tap window function coefficients (C1 to C5). An envelop signal is risen early by the window function process, and the state of the envelope signal on the falling is maintained so that an adjusted signal is output to the power supply circuit 4.

According to the process in the voltage control adjusting section 16, the window function coefficients is made to be asymmetrical, particularly the window function on a left side is set to be larger than the window function on a right side so that the rising of the signal is hastened. The state of the envelope signal is maintained on the falling, and unnecessary power consumption on the signal falling is eliminated, so that the power use efficiency of the power amplifying apparatus can be improved.

According to the above embodiment, a window function processing circuit is used, window function coefficients are suitably selected so that the speed of the envelope signal is adjusted. A driving voltage which is optimum for the driving property of the voltage control adjusting section 16 can be supplied to the power amplifier 5.

The power supply circuit 4 and the voltage control adjusting section 16 in the second embodiment correspond to the voltage supply means and window function processing means of the disclosed power amplifying apparatus, respectively. The window function coefficient multiplying sections 17 and the maximum value acquiring section 18 in the second embodiment correspond to a multiplying circuit and a maximum value acquiring circuit of the disclosed power amplifying apparatus, respectively.

Third Embodiment

A third embodiment of the disclosed power amplifying apparatus is described below.

Figure 11:
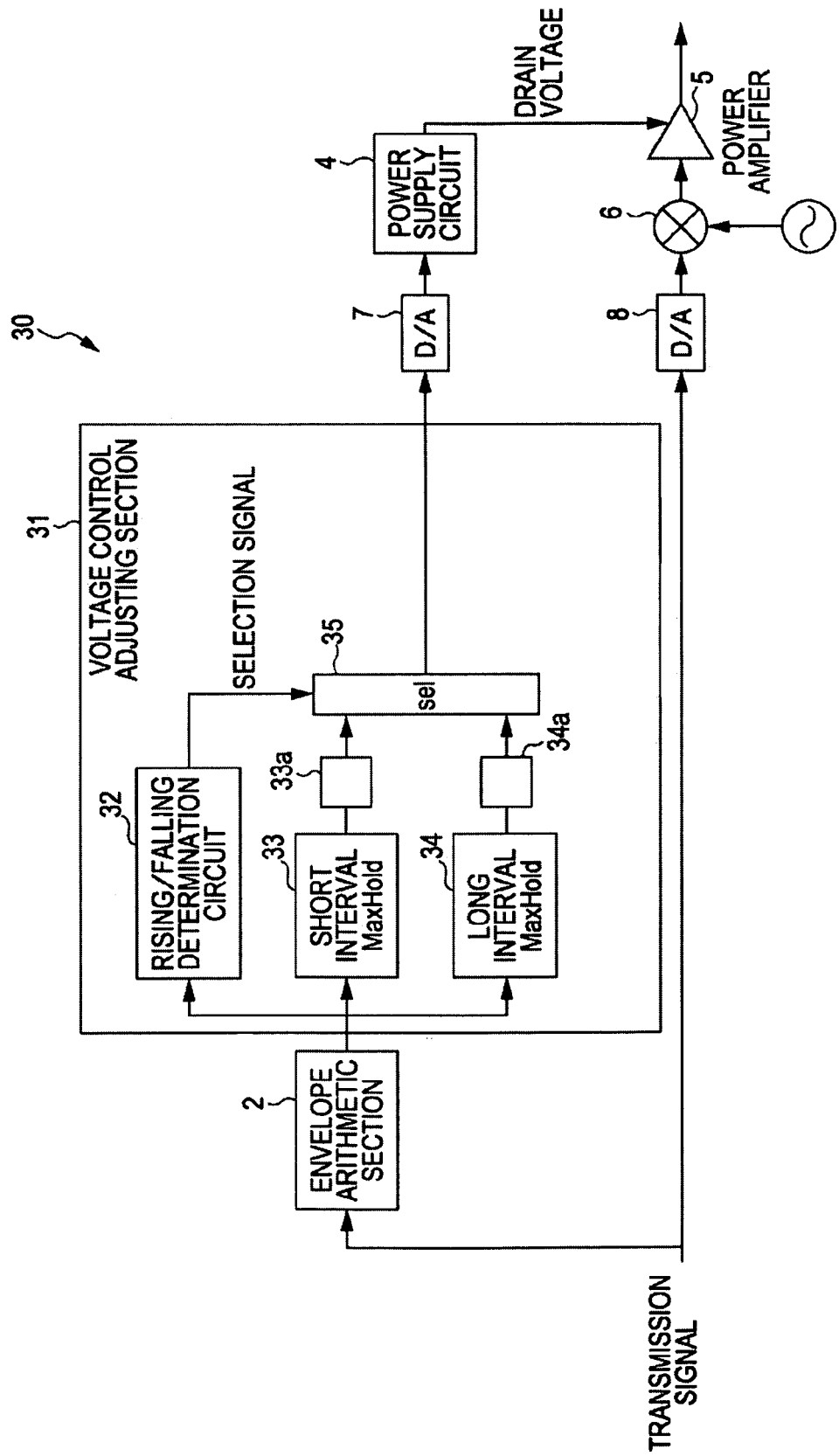
FIG. 11 is a configurational diagram of the power amplifying apparatus according to a third embodiment.

FIG. 11 is a circuit diagram of the power amplifying apparatus 30 according to the third embodiment. The power amplifying apparatus 30 includes the envelope arithmetic section 2, a voltage control adjusting section 31, the power supply circuit 4, the power amplifier 5, the carrier wave input section 6 and the like. The power amplifying apparatus 30 of the third embodiment has the voltage control adjusting section 31 whose constitution is different from that of the apparatus shown in FIG. 6, and the other circuits are similar to those in FIG. 6. Therefore, the constitution of the voltage control adjusting section 31 is described, and description about the remaining circuit configuration is omitted.

The voltage control adjusting section 31 includes a rising/falling determination circuit 32, a short interval maximum value holding circuit 33, a long interval maximum value holding circuit 34, and a selecting circuit 35. The rising/falling determination circuit 32 has the same constitution as that of the rising/falling determination circuit 12 described with reference to FIG. 6, and detects a trough and a crest of the envelope signal. When detecting a trough of the envelope signal, the rising/falling determination circuit 32 determines that the envelope signal rises thereafter, and when detecting a crest of the envelope signal, it determines that the envelope signal falls thereafter, and outputs a corresponding selection signal to the selecting circuit 35.

The short interval maximum value holding circuit 33 and the long interval maximum value holding circuit 34 basically have the same circuit configuration, but the numbers of latch circuits and the numbers of sampling clocks to be used are different. The circuit configuration of the long interval maximum value holding circuit 34 is described with reference to FIG. 12. The long interval maximum value holding circuit 34 includes latch circuits 36a to 36d, a maximum value acquiring circuit 37, a ⅕ frequency dividing circuit 38, and a maximum value holding circuit 39. A sampling clock is input into clock input terminals (CLK) of the latch circuits 36a to 36d and the ⅕ frequency dividing circuit 38, and envelope signals to be input into data terminals (D) are synchronized with the sampling clocks so as to be transmitted sequentially from output terminals (Q) to right adjacent latch circuits.

The maximum value acquiring circuit 37 acquires maximum data in data latched by the latch circuits 36a to 36d, and outputs it to the maximum value holding circuit 39. The maximum value holding circuit 39 inputs the data of the maximum value acquired by the maximum value acquiring circuit 37 through a D terminal, and makes it synchronous with a clock signal output from the ⅕ frequency dividing circuit 38 so as to output the data of the maximum value from a Q terminal to the selecting circuit 35.

Figure 13:
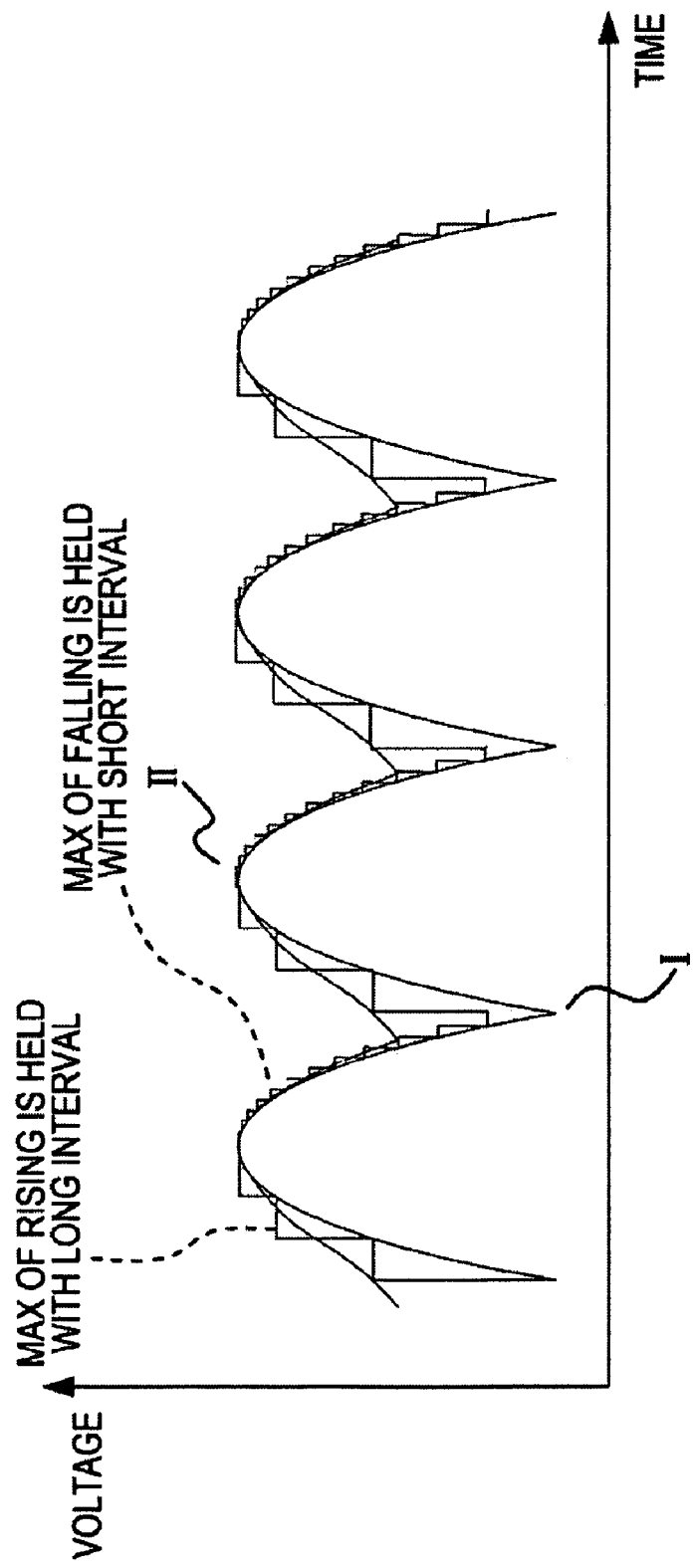
FIG. 13 is a waveform chart illustrating an operation of the third embodiment.

FIG. 13 is a waveform chart illustrating speed adjustments of the envelope signal in the voltage control adjusting section 31. The envelope signal calculated by the envelope arithmetic circuit 2 is input into the rising/falling determination circuit 32, and is input into the short interval maximum value holding circuit 33 and the long interval maximum value holding circuit 34.

When the rising/falling determination circuit 32 detects a trough (I shown in FIG. 13) of the envelope signal, it determines that the envelope signal rises thereafter, and outputs a determined signal for selecting the long interval maximum value holding circuit 34 to the selecting circuit 35. A delay circuit 34a is set at an output of the long interval maximum value holding circuit 34, and the output from the long interval maximum value holding circuit 34 is delayed by predetermined time T so as to be output to the selecting circuit 35.

The long interval maximum value holding circuit 34 acquires data of maximum value among outputs of five sampling clocks. Therefore, the long interval maximum value holding circuit 34 is used on the rising of the envelope signal, so that the rising interval of the envelope signal can be adjusted to a low speed.

On the other hand, when the rising/falling determination circuit 32 detects a crest (II shown in FIG. 13) of the envelope signal, it determines that the envelope signal falls thereafter, and outputs a determined signal for selecting the short interval maximum value holding circuit 33 to the selecting circuit 35. A delay circuit 33a is set also at an output of the short interval maximum value holding circuit 33, and the output from the short interval maximum value holding circuit 33 is delayed by predetermined time T so as to be output to the selecting circuit 35. In this case, data of the maximum value among the outputs of two or three sampling clocks, namely, data of maximum value in a narrow sampling interval is obtained as illustrated in FIG. 13. Therefore, when the short interval maximum value holding circuit 33 is used on the falling of the envelope signal, the falling interval of the envelope signal can be adjusted to a high speed.

The envelope signal whose speed is adjusted in such a manner is output to the power supply circuit 4 which is a switching amplifier via the D/A converting circuit 7. After the adjusted signal is pulse-modulated, it is amplified by a power switch so as to be supplied to a LC filter. The amplified signal becomes an optimum drain voltage according to an operation property at the time of passing through the LC filter, so as to be supplied to the power amplifier 5. That is to say, the falling of the drain voltage is a voltage tracking the envelope signal accurately, and eliminates useless power in the power amplifier 5 so as to be capable of improving the power use efficiency.

According to the above constitution, the short interval maximum value holding circuit is used instead of a high-speed low pass filter, and the long interval maximum value holding circuit is used instead of a low-speed low pass filter. When the falling of the envelope signal is detected, the output from the short interval maximum value holding circuit is selected, and when the rising of the envelope signal is detected, the output from the long interval maximum value holding circuit is selected. Driving voltages which are optimum for the driving property of the voltage supply means can be supplied to the power amplifier.

The power supply circuit 4, the rising/falling determination circuit 32 and the selecting circuit 35 in the third embodiment correspond to the voltage supply means, the determination means and the selecting means of the disclosed power amplifying apparatus, respectively.

Figure 12:
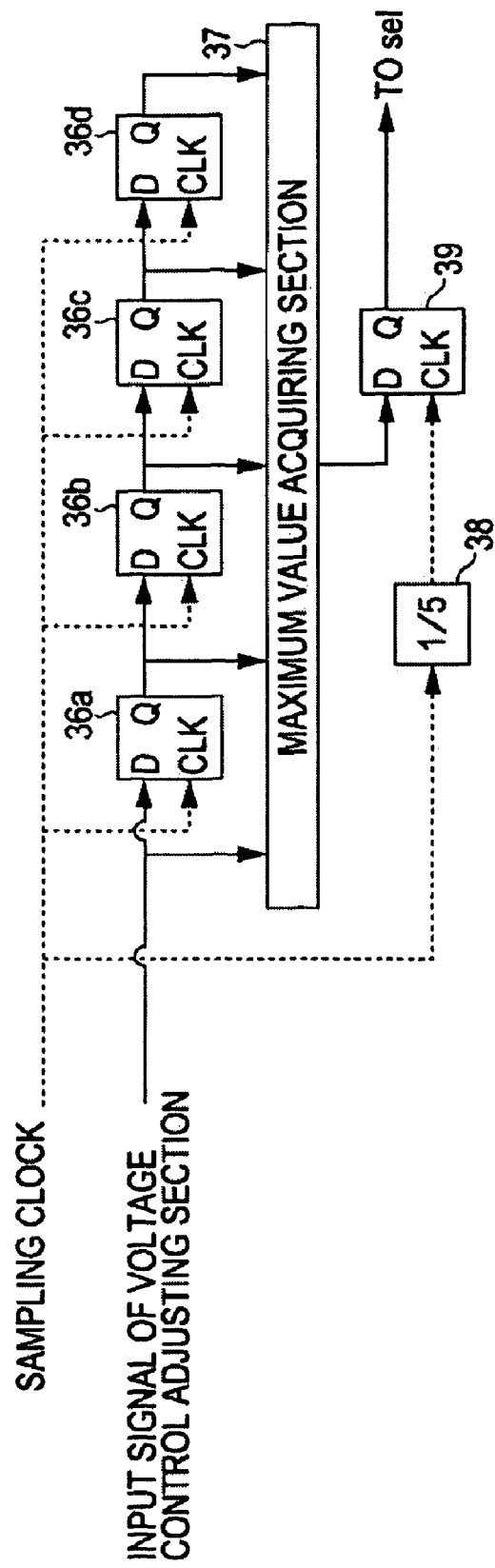
FIG. 12 is a diagram illustrating a circuit configuration of a long interval maximum value holding circuit.

The circuit in FIG. 12 is described above as the long interval maximum value holding circuit 34, and the short interval maximum value holding circuit 33 is described as a circuit which acquires maximum data among two or three sampling clocks (in this case, the short interval maximum value holding circuit 33 includes one or two latch circuit(s) and ½ or ⅓ frequency dividing circuit). However, the circuit in FIG. 12 may be the short interval maximum value holding circuit 33, and the long interval maximum value holding circuit 34 may be a circuit which acquires maximum data among six or more sampling clocks (in this case, the long interval maximum value holding circuit 34 includes six or more latch circuits).

Fourth Embodiment

A fourth embodiment of the disclosed power amplifying apparatus is described below.

Figure 14:
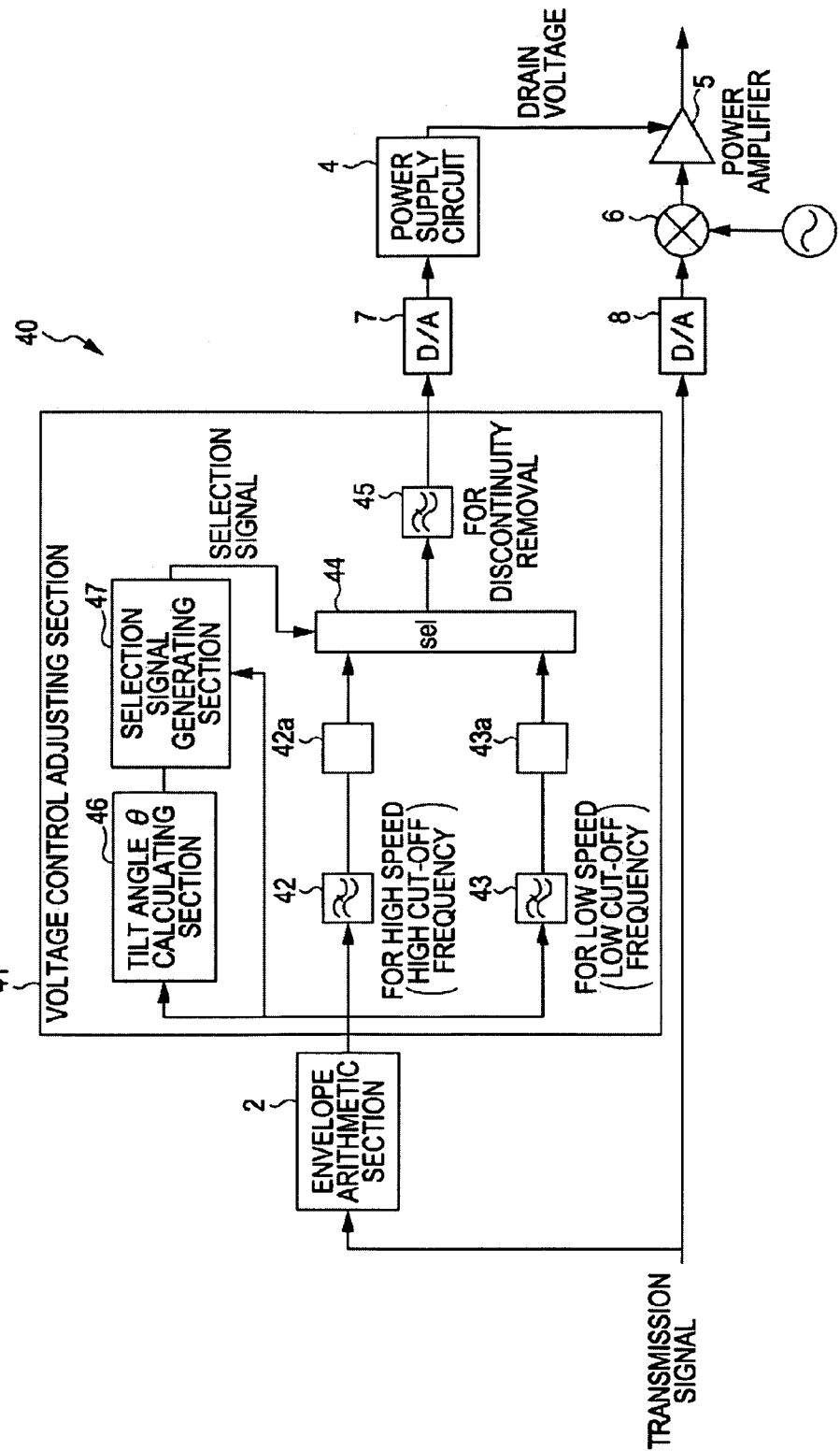
FIG. 14 is a configurational diagram of the power amplifying apparatus according to a fourth embodiment.

FIG. 14 is a circuit diagram of the power amplifying apparatus 40 according to the fourth embodiment, and it includes the envelope arithmetic section 2, a voltage control adjusting section 41, the power supply circuit 4 and the power amplifier 5. The power amplifying apparatus 40 in the fourth embodiment has the voltage control adjusting section 41 whose constitution is different from that of the apparatus shown in FIG. 6, and the other circuits are similar to those in FIG. 6. Therefore, the constitution of the voltage control adjusting section 41 is described, and description about the remaining circuit configuration is omitted.

The voltage control adjusting section 41 includes low pass filters (LPF) 42 and 43, a selecting circuit 44, a discontinuity removing circuit 45, a tilt angle θ calculating section 46 and a selection signal generating section 47. Similar to those shown in FIG. 6, the low pass filter (LPF) 42 is a low pass filter for a high cut-off frequency (high-speed), and the low pass filter (LPF) 43 is a low pass filter for a low cut-off frequency (low speed).

Figure 15:
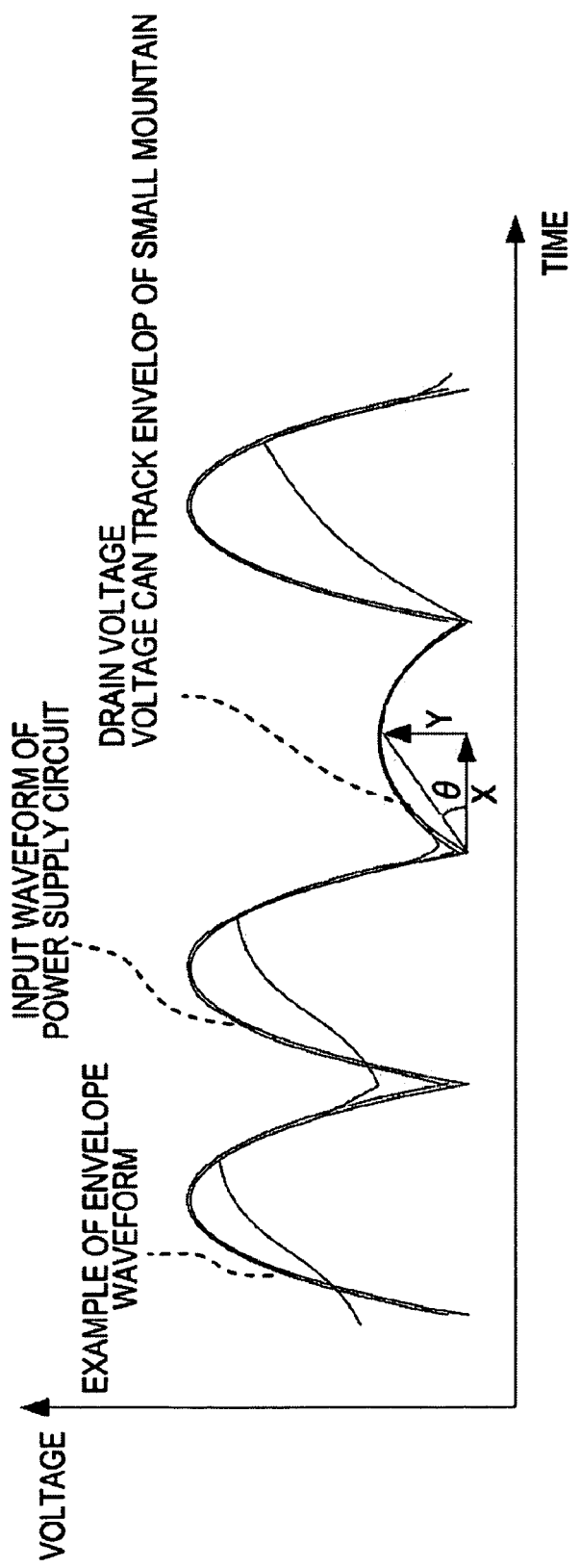
FIG. 15 is a waveform chart showing a processing operation according to the fourth embodiment.

The tilt angle θ calculating section 46 calculates a tilt angle θ from a waveform shape of an envelope signal to be input. Concretely, as shown in FIG. 15, the tilt angle θ is calculated based on time on an abscissa axis (X axis) and a voltage value (amplitude value) on an ordinate axis (Y axis). For example, the tilt angle θ calculating section 46 acquires time information from a time counting circuit, not shown, and measures a voltage (amplitude) from a trough to a peak value of the envelope signal to be input so as to calculate the tilt angle θ.

The tilt angle θ calculating section 46 outputs data about the measured tilt angle θ to the selection signal generating section 47. The selection signal generating section 47 compares the input data about the tilt angle θ with data about a preset threshold. When the data about the tilt angle θ is smaller than the data about the threshold, the selection signal generating section 47 determines that a change in the envelope signal is such that the power supply circuit 4 at a later stage can sufficiently track with using the high-speed low pass filter (LPF) 42, so outputs a selection signal for the LPF 42. On the other hand, when the data about the tilt angle θ is larger than the data about the threshold, the selection signal generating section 47 determines that the change in the envelope signal exceeds a level such that the power supply circuit 4 at the later stage can track with using the high-speed low pass filter (LPF) 42, so outputs a selection signal for the low-speed low pass filter (LPF) 43.

According to such a constitution, a drain voltage which is suitable for the tilt angle θ of the envelope signal can be generated, and the drain voltage which efficiently tracks the envelope signal can drive the power amplifier 5.

The power supply circuit 4, the selecting circuit 44 and the tilt angle θ calculating section 46 in the fourth embodiment correspond to the voltage supply means, the selecting means and the calculating means of the disclosed power amplifying apparatus, respectively.

The above description refers to the constitution that when the data about the tilt angle θ is larger than the data about the threshold, the low-speed low pass filter (LPF) 43 is selected. Further, the constitution may be such that the rising/falling determination circuit is provided, and when the data about the tilt angle θ is larger than the data about the threshold, the low pass filter (LPF) 42 or 43 may be selected according to a determined result of the rising/falling determination circuit.

Fifth Embodiment

A fifth embodiment 5 of the disclosed power amplifying apparatus is described below.

Figure 16:
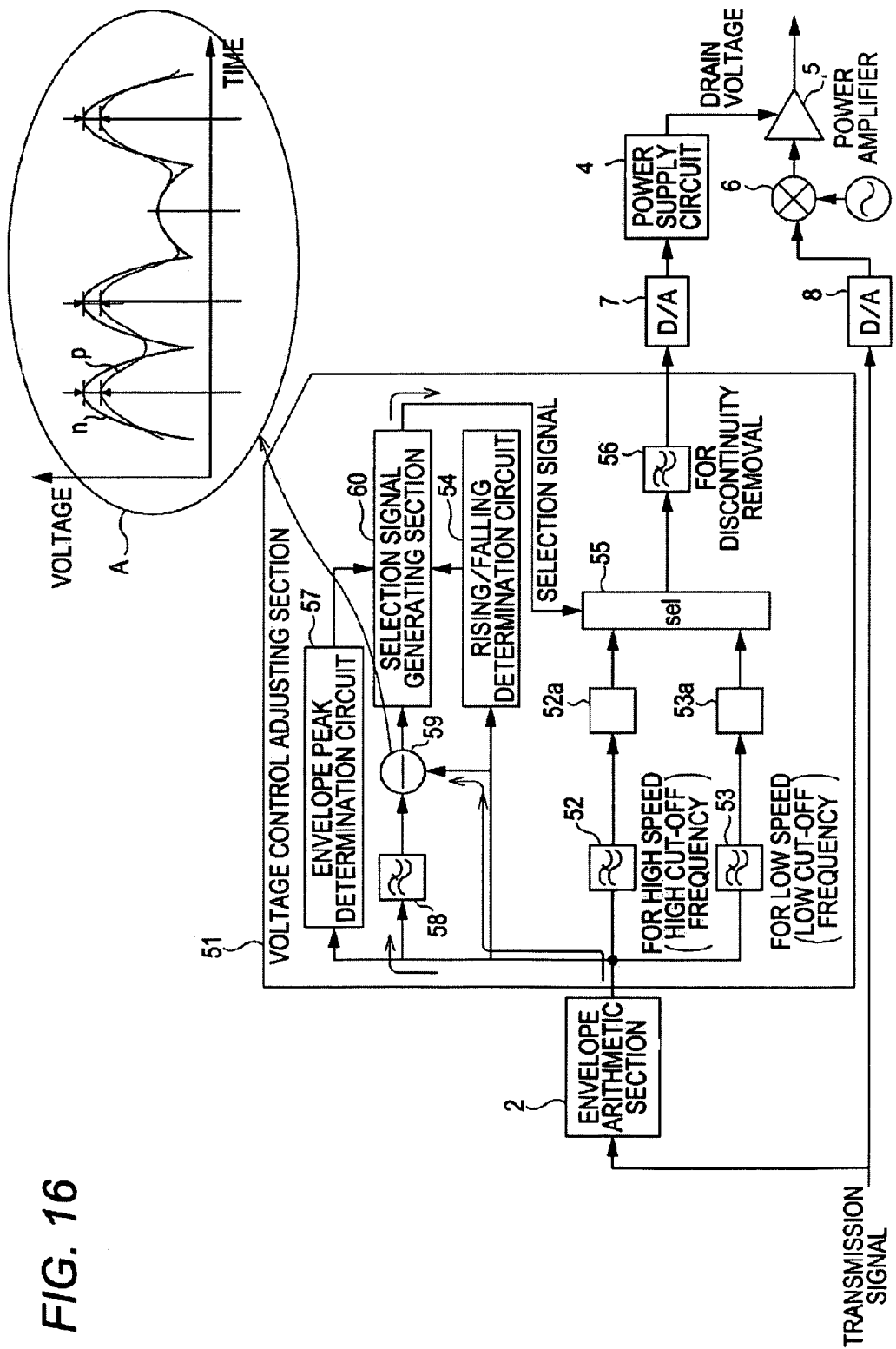
FIG. 16 is a circuit diagram illustrating the power amplifying apparatus according to a fifth embodiment.

FIG. 16 is a circuit diagram illustrating a power amplifying apparatus 50 according to the fifth embodiment, and it includes the envelope arithmetic section 2, a voltage control adjusting section 51, the power supply circuit 4 and the power amplifier 5. The power amplifying apparatus 50 in the fifth embodiment has the voltage control adjusting section 51 whose constitution is different from that of the apparatus shown in FIG. 6, and the other circuits are similar to those in FIG. 6. Therefore, the constitution of the voltage control adjusting section 51 is described, and description about the remaining circuit configurations is omitted.

The voltage control adjusting section 51 includes low-pass filters (LPF) 52 and 53, a rising/falling determination circuit 54, a selecting circuit 55, a discontinuity removing circuit 56, an envelope peak determination circuit 57, a low pass filter 58, a difference detecting circuit 59 and a selection signal generating section 60. Similar to those described above, the low pass filter (LPF) 52 is a low pass filter for a high cut-off frequency (high speed), and the low pass filter (LPF) 53 is a low pass filter for a low cut-off frequency (low speed). When the rising/falling determination circuit 54 detects a trough of the envelope signal, it determines that the envelope signal rises thereafter, and when detecting a crest of the envelope signal, it determines that the envelop signal falls thereafter.

The rising/falling determination circuit 54 outputs a corresponding determined signal to the selection signal generating section 60.

The envelope peak determination circuit 57 determines a peak of the envelope signal, and outputs a determined result to the selection signal generating section 60. The difference detecting circuit 59 compares the envelope signal with an output waveform from the low pass filter 58 and detects a difference so as to output it to the selection signal generating section 60.

The selection signal generating section 60 compares difference data output from the difference detecting circuit 59 with a preset threshold at timing that the peak determined signal is supplied from the envelope peak determination circuit 57. When the difference data is larger than the preset threshold, the selection signal generating section 60 outputs the determined signal output from the rising/falling determination circuit 54 as a selection signal to the selecting circuit 55.

"A" shown in FIG. 16 is a waveform chart illustrating a circuit operation in the difference detecting circuit 59, a waveform n shown in FIG. 16 is a waveform of the envelope signal output from the envelope arithmetic section 2, and a waveform p is a waveform output from the low pass filter 58. The difference detecting circuit 59 detects a difference between the waveforms n and p at timing that the envelope waveform reaches a peak, and when the difference is larger than a preset threshold, it outputs the determined signal output from the rising/falling determination circuit 54 to the selecting circuit 55.

That is to say, this case is that a change in the envelope signal is sharp, and in this case, the low pass filter (LPF) 52 or 53 is selected according to the determined signal output from the rising/falling determination circuit 54. The selected low pass filter (LPF) 52 or 53 adjusts the speed of the envelope signal. This speed adjustment is as mentioned above, and when the trough of the envelope signal is detected, the determination is made that the envelope signal rises thereafter, and the low pass filter (LPF) 53 is selected so as to adjust the envelope signal to a low speed. On the other hand, when the rising/falling determination circuit 54 detects the crest of the envelope signal, it determines that the envelope signal falls thereafter, and selects the low pass filter (LPF) 52 so as to adjust the envelope signal to a high speed.

On the other hand, when the difference detected by the difference detecting circuit 59 is smaller than the preset threshold, the selection signal generating section 60 outputs a selection signal for selecting the low pass filter (LPF) 52 to the selecting circuit 55. In this case, the change in the envelope signal is gentle, and the low pass filter whose cut-off frequency is high (high speed) is used to adjust the envelope signal so as to output it to the power supply circuit 4.

According to the above constitution, when the change in the envelope signal is sharp, the rising of the envelope signal is adjusted to low speed, and the falling is adjusted to high speed so that the power use efficiency is improved. When the change in the envelope signal is gentle, the envelope signal is adjusted to high speed so that the power use efficiency can be further improved.

The power supply circuit 4, the rising/falling determination circuit 54, the selecting circuit 55, the envelope peak determination circuit 57, the difference detecting circuit 59 and the selection signal generating section 60 in the fifth embodiment correspond to the voltage supply means, the determination means, the selecting means, the peak determination means, the difference detecting means and the selection signal generating means of the disclosed power amplifying apparatus, respectively.

According to the power amplifying apparatus and the method for controlling a supply voltage to the power amplifier according to the first to fifth embodiments, on the rising and the falling of the envelope signal, the adjustment speed in the voltage control adjusting section is changed, and the power use efficiency of the power amplifier can be improved without deteriorating the adjustment speed on the falling of the envelope signal.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

In regard to Embodiments 1 to 5 described above, the following additional descriptions are disclosed.

(Additional Note 1)

A power amplifying apparatus including:

a high-speed low pass filter which inputs an envelope signal included in a transmission signal therein;

a low-speed low pass filter which inputs the envelope signal therein;

determination means which input the envelope signal therein and determines rising and falling of the envelope signal;

selecting means which select one of the high-speed low pass filter and the low-speed low pass filter according to a determined result in the determination means; and voltage supply means which generate a voltage based on a signal input according to a selection by the selecting means and supplies the voltage to a power amplifier which inputs the transmission signal therein so as to amplify a power of the transmission signal.

(Additional Note 2)

The power amplifying apparatus in additional note 1, in which when the determination means detect a trough of the envelope signal, the determination means output a signal for selecting the low-speed low pass filter to the selecting means, and when the determination means detect a crest of the envelope signal, the determination means output a signal for selecting the high-speed low pass filter to the selecting means.

(Additional Note 3)

A power amplifying apparatus including:

window function processing means which input an envelope signal included in a transmission signal therein, and generate a signal which hastens rising of the envelope signal and tracks falling of the envelope signal at a high speed; and voltage supply means which generate a voltage according to an output from the window function processing means and supply the voltage to a power amplifier which inputs the transmission signal therein so as to amplify a power of the transmission signal.

(Additional Note 4)

The power amplifying apparatus in additional note 3 in which the window function processing means include a latch circuit, a multiplying circuit which multiplies the envelope signal input into the latch circuit by a window function coefficient, and a maximum value acquiring circuit which acquires a maximum value of multiplied results in the multiplying circuit.

(Addition Note 5)

A power amplifying apparatus including:

a short interval maximum value holding circuit which inputs envelope information included in a transmission signal therein;

a long interval maximum value holding circuit which inputs the envelope information therein;

determination means which input the envelope information therein and determine rising or falling of an envelope waveform of the envelope information; and selecting means which select one of the short interval maximum value holding circuit and the long interval maximum value holding circuit according to a determined result of the determination means so as to select a signal output from one of the maximum value holding circuits; and voltage supply means which supply a voltage according to the output from the selecting means to a power amplifier which inputs the transmission signal therein so as to amplify a power of the transmission signal.

(Additional Note 6)

The power amplifying apparatus in additional note 5 in which when the determination means detect a trough of the envelope signal, the determination means output a signal for selecting the long interval maximum value holding circuit to the selecting means, and when the determination means detect a crest of the envelope signal, the determination means output a signal for selecting the short interval maximum value holding circuit to the selecting means.

(Additional Note 7)

A power amplifying apparatus including:

a high-speed low pass filter which inputs an envelop signal included in a transmission signal therein;

a low-speed low pass filter which inputs the envelope signal therein;

calculating means which input the envelope signal therein so as to calculate a tilt angle of the envelope signal;

selecting means which select one of the high-speed low pass filter and the low-speed low pass filter based on a calculated result of the tilt angle; and voltage supply means which supply a voltage according to an output from the selecting means to a power amplifier which inputs the transmission signal therein so as to amplify a power of the transmission signal.

(Additional Note 8)

The power amplifying apparatus in additional note 7 in which when the calculated result of the tilt angle is smaller than a preset threshold, the selecting means selects an output from the high-speed low pass filter.

(Additional Note 9)

The power amplifying apparatus in additional note 7 or 8, in which determination means which determine rising or falling of the envelope signal is provided, and when the calculated result of the tilt angle is larger than a preset threshold, a selection signal according to a determined result in the determination means is output to the selecting means.

(Additional Note 10)

The power amplifying apparatus in additional note 1, further including:

a low pass filter which inputs the envelope signal therein;

peak determination means which input the envelope signal therein so as to determine a peak of the envelope signal;

difference detecting means which detect a difference between the envelope signal and a signal output through the low pass filter; and selection signal generating means which, when the peak determination means determines the peak and a detected result of the difference detecting means is not less than a predetermined value, generate an output for selecting one of the high-speed low pass filter and the low-speed low pass filter by the selecting means based on a determined result of the determination means.

(Additional Note 11)

The power amplifying apparatus in additional note 10 in which when the detected result of the difference detecting means is not more than the predetermined value, the output from the high-speed low pass filter is supplied to the voltage supply means.

(Additional Note 12)

A control method for a supply voltage to a power amplifier which amplifies a power of a transmission signal based on envelope information of the transmission signal, wherein the control method for a voltage to the power amplifier is changed on rising and falling of an envelope signal as the envelope information.

(Additional Note 13)

The control method for the supply voltage to the power amplifier in additional note 12, in which a voltage is allowed to rise early on the rising of the envelope signal, and falling of the voltage is allowed to track the envelope signal at a high speed.

The invention claimed is:

1. A power amplifying apparatus including:
a high-speed low pass filter which inputs an envelope signal included in a transmission signal therein;
a low-speed low pass filter which inputs the envelope signal therein;
a determination circuit which inputs the envelope signal therein and determines rising and falling of the envelope signal;
a selecting circuit which selects one of the high-speed low pass filter and the low-speed low pass filter according to a determined result in the determination circuit; and
a power supply circuit which generates a voltage based on a signal input according to a selection by the selecting circuit and supplies the voltage to a power amplifier which inputs the transmission signal therein so as to amplify a power of the transmission signal.

2. The power amplifying apparatus according to claim 1, in which when the determination circuit detects a trough of the envelope signal, the determination circuit outputs a signal for selecting the low-speed low pass filter to the selecting circuit, and when the determination circuit detects a crest of the envelope signal, the determination circuit outputs a signal for selecting the high-speed low pass filter to the selecting circuit.

3. A power amplifying apparatus including:
a voltage control adjusting section which inputs an envelope signal included in a transmission signal therein, and generates a signal which hastens rising of the envelope signal and tracks falling of the envelope signal at a high speed; and
a power supply circuit which generates a voltage according to an output from the voltage control adjusting section and supplies the voltage to a power amplifier which inputs the transmission signal therein so as to amplify a power of the transmission signal,
wherein the voltage control section applies window function coefficients to the envelope signal, and
wherein a window function coefficient applied to the envelope signal close to an input side of the voltage control adjusting section is greater than a window function coefficient applied to the envelope signal close to an output side of the voltage control adjusting section.

4. The power amplifying apparatus according to claim 3 in which the voltage control adjusting section includes a latch circuit, a multiplying circuit which multiplies the envelope signal input into the latch circuit by a window function coefficient, and a maximum value acquiring circuit which acquires a maximum value of multiplied results in the multiplying circuit.

5. A power amplifying apparatus including:
a short interval maximum value holding circuit which inputs envelope information included in a transmission signal therein;
a long interval maximum value holding circuit which inputs the envelope information therein;
a determination circuit which inputs the envelope information therein and determines rising or falling of an envelope waveform of the envelope information; and
a selecting circuit which selects one of the short interval maximum value holding circuit and the long interval maximum value holding circuit according to a determined result of the determination circuit so as to select a signal output from one of the maximum value holding circuits; and
a power supply circuit supplies a voltage according to the output from the selecting circuit to a power amplifier which inputs the transmission signal therein so as to amplify a power of the transmission signal.

6. The power amplifying apparatus according to claim 5 in which when the determination circuit detects a trough of the envelope signal, the determination circuit outputs a signal for selecting the long interval maximum value holding circuit to the selecting circuit, and when the determination circuit detects a crest of the envelope signal, the determination circuit outputs a signal for selecting the short interval maximum value holding circuit to the selecting circuit.

7. A control method of a voltage control adjusting section for a supply voltage to a power amplifier which amplifies a power of a transmission signal based on envelope information of the transmission signal,
wherein the control method for a voltage to the power amplifier is changed on rising and falling of an envelope signal as the envelope information,
wherein window function coefficients are applied to the envelope signal, and
wherein a window function coefficient applied to the envelope signal close to an input side of the voltage control adjusting section is greater than a window function coefficient applied to the envelope signal close to an output side of the voltage control adjusting section.

8. The control method for the supply voltage to the power amplifier according to claim 7, in which a voltage is allowed to rise early on the rising of the envelope signal, and falling of the voltage is allowed to track the envelope signal at a high speed.

* * * * *